US008233685B2

(12) United States Patent
Chang et al.

(10) Patent No.: US 8,233,685 B2
(45) Date of Patent: Jul. 31, 2012

(54) THREE-DIMENSIONAL MICROSCOPIC MAGNETIC RESONANCE ANGIOGRAPHY

(75) Inventors: Chen Chang, Taipei (TW); Chien-Yuan Lin, Taipei (TW); Jyh-Horng Chen, Taipei (TW)

(73) Assignee: Academia Sinica, Taipei (TW)

( * ) Notice: Subject to any disclaimer, the term of this patent is extended or adjusted under 35 U.S.C. 154(b) by 578 days.

(21) Appl. No.: 12/434,077

(22) Filed: May 1, 2009

(65) Prior Publication Data

US 2009/0274352 A1  Nov. 5, 2009

Related U.S. Application Data

(60) Provisional application No. 61/049,856, filed on May 2, 2008.

(51) Int. Cl.
*G06K 9/00* (2006.01)
(52) U.S. Cl. .......................................... 382/128; 382/131
(58) Field of Classification Search .................. 382/128, 382/131
See application file for complete search history.

(56) References Cited

U.S. PATENT DOCUMENTS

| 2004/0106864 A1* | 6/2004 | Rose et al. ................... 600/410 |
| 2004/0218794 A1* | 11/2004 | Kao et al. ..................... 382/128 |
| 2007/0112264 A1* | 5/2007 | Wu et al. ...................... 600/410 |
| 2008/0221441 A1* | 9/2008 | Bjornerud et al. ............ 600/425 |
| 2010/0016706 A1* | 1/2010 | Wohlgemuth ................ 600/410 |

* cited by examiner

*Primary Examiner* — Joseph Chang
*Assistant Examiner* — Jeffrey Shin
(74) *Attorney, Agent, or Firm* — Harness, Dickey & Pierce, PLC

(57) ABSTRACT

A method comprises performing a first T2-weighted imaging (T2WI) on a subject; injecting the subject with a contrast agent after performing the first T2WI; and waiting a predetermined period of time before performing a second T2WI on the subject. The first T2WI and second T2WI are then co-registered. The co-registered first T2WI and co-registered second T2WI are then trimmed. A $\Delta R_2$ map is then determined based on each pixel of the trimmed first T2WI and corresponding pixels of the trimmed second T2WI. A three-dimensional map is constructed based on the $\Delta R_2$ map.

36 Claims, 8 Drawing Sheets
(6 of 8 Drawing Sheet(s) Filed in Color)

THREE-DIMENSIONAL MICROSCOPIC MAGNETIC RESONANCE ANGIOGRAPHY

FIELD

The present disclosure relates to magnetic resonance imaging and more particularly to three-dimensional microscopic magnetic resonance angiography.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The normal function and structure of microvessels are crucial to the survival of tissue cell due to essential nutrients passing through their walls. Structural and functional cerebromicrovascular abnormalities are implicated in the pathogenesis of brain diseases. See, for example, Perlmutter, L. S. and Chui, H. C., 1990, Microangiopathy, the vascular basement membrane and Alzheimer's disease: a review, Brain Res Bull. 24, 677-686; Buee, L., H of, P. R. and Delacourte, A., 1997, Brain microvascular changes in Alzheimer's disease and other dementias, Ann N Y Acad Sci. 826, 7-24; and Serne, E. H., de Jongh, R. T., Eringa, E. C., R G, I. J. and Stehouwer, C. D., 2007, Microvascular dysfunction: a potential pathophysiological role in the metabolic syndrome, Hypertension. 50, 204-211, the disclosures of which are incorporated herein by reference in their entirety.

Imaging methods for assessing the cerebromicrovasculature is therefore important in a wide range of clinical and neuroscience-research fields. The most commonly used magnetic resonance angiography (MRA) techniques to visualize the vasculature are time-of-flight MRA (TOF-MRA) and contrast-enhanced MRA (CE-MRA). TOF-MRA depends on the motion of water protons in inflowing blood, which is sensitive to rapidly inflowing spins (i.e., in arteries), whereas CE-MRA employs contrast agents to detect low flow rates in veins. See, for example, Reese, T., Bochelen, D., Sauter, A., Beckmann, N. and Rudin, M., 1999, Magnetic resonance angiography of the rat cerebrovascular system without the use of contrast agents, NMR Biomed. 12, 189-196; and Miraux, S., Serres, S., Thiaudiere, E., Canioni, P., Merle, M. and Franconi, J. M., 2004, Gadolinium-enhanced small-animal TOF magnetic resonance angiography, Magma. 17, 348-352, the disclosures of which are incorporated herein by reference in their entirety.

The abilities of these methods to view larger arteries or veins have been demonstrated, and have been used to study tumor-related vasculature, transient focal ischemia, and genetic variations of the vascular structure. See, for example, van Vliet, M., van Dijke, C. F., Wielopolski, P. A., ten Hagen, T. L., Veenland, J. F., Preda, A., Loeve, A. J., Eggermont, A. M. and Krestin, G. P., 2005, MR angiography of tumor-related vasculature: from the clinic to the micro-environment, Radiographics, 25 Suppl. 1, S85-97, discussion S97-88; Beckmann, N., 2000, High resolution magnetic resonance angiography non-invasively reveals mouse strain differences in the cerebrovascular anatomy in vivo, Magn Reson Med. 44, 252-258; Besselmann, M., Liu, M., Diedenhofen, M., Franke, C. and Hoehn, M., 2001. MR angiographic investigation of transient focal cerebral ischemia in rat, NMR Biomed. 14, 289-296; and Brubaker, L. M., Bullitt, E., Yin, C., Van Dyke, T. and Lin, W., 2005, Magnetic resonance angiography visualization of abnormal tumor vasculature in genetically engineered mice, Cancer Res. 65, 8218-8223, the disclosures of which are incorporated herein by reference in their entirety.

However, since TOF-MRA signals are naturally related to high-flow-rate vessels, they have limitations in visualizing small vessels even at high resolution, and suffer from flow-related artifacts including signal loss in areas with turbulent flow and motion artifacts from pulsatile flow. For example, see Pipe, J. G., 2001, Limits of time-of-flight magnetic resonance angiography, Top Magn Reson Imaging 12, 163-174, the disclosure of which is incorporated herein by reference in its entirety. CE-MRA with the injection of Gd-DTPA, which has a short intravascular (IV) half-life and rapidly redistributes into the extracellular space, may not satisfy the long acquisition time required for high-resolution MRA applications.

SUMMARY

A method comprises performing a first T2-weighted imaging (T2WI) on a subject; injecting the subject with a contrast agent after performing the first T2WI; and waiting a predetermined period of time before performing a second T2WI on the subject. The first T2WI and second T2WI are then co-registered. The co-registered first T2WI and co-registered second T2WI are then trimmed. A $\Delta R_2$ map is then determined based on each pixel of the trimmed first T2WI and corresponding pixels of the trimmed second T2WI. A three-dimensional map is constructed based on the $\Delta R_2$ map.

The method further comprises generating 3D images of vessels of the subject based on the 3D map without sensitivity to flow of matter through the vessels, where the vessels include at least one of veins, sinuses, arterioles, venules, and capillaries. The method further comprising rendering in-vivo microvascular architecture and generating hemodynamic data including microvascular fluid volume data for the vessels of the subject based on the 3D map. The method further comprises determining functional and structural changes in microvasculature of a tumor based on the 3D images and the hemodynamic parameters.

In other features, a system comprises a three-dimensional (3D) imaging module and a hemodynamic data module. The three-dimensional (3D) imaging module generates 3D images of vessels of a subject without sensitivity to flow of matter through the vessels. The 3D images render in-vivo microvascular architecture of the vessels. The vessels include at least one of veins, sinuses, arterioles, venules, and capillaries. The hemodynamic data module generates hemodynamic data including microvascular fluid volume data for the vessels based on the 3D images. The 3D imaging module generates the 3D images based on steady-state 3D $\Delta R_2$-based microscopic magnetic resonance angiography (3D$\Delta R_2$-mMRA). The hemodynamic data module generates the hemodynamic data based on 3D$\Delta R_2$-mMRA.

The system further comprises a T2-weighted imaging (T2WI) module, a co-registering module, a trimming module, a $\Delta R_2$ mapping module, and a 3D mapping module. The T2WI module performs a first T2-weighted imaging (T2WI) on the subject and performs a second T2WI on the subject after the subject is injected with a contrast agent. The co-registering module co-registers the first T2WI and the second T2WI and generates co-registered first T2WI and co-registered second T2WI. The trimming module trims the co-registered first T2WI and the co-registered second T2WI and generates trimmed first T2WI and trimmed second T2WI.

The ΔR$_2$ mapping module generates a ΔR$_2$ map based on each pixel of the trimmed first T2WI and corresponding pixels of the trimmed second T2WI. The 3D mapping module generates a 3D map based on the ΔR$_2$ map. The 3D imaging module generates the 3D images based on the 3D map. The hemodynamic data module generates the hemodynamic data based on the 3D map.

In still other features, the systems and methods described above are implemented by a computer program executed by one or more processors. The computer program can reside on a computer readable medium such as but not limited to memory, nonvolatile data storage, and/or other suitable tangible storage mediums.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The patent or application file contains at least one drawing executed in color. Copies of this patent or patent application publication with color drawings will be provided by the Patent and Trademark Office upon request and payment of necessary fee.

The present disclosure will become more fully understood from the detailed description and the accompanying drawings, wherein.

DETAILED DESCRIPTION

Figure 2:
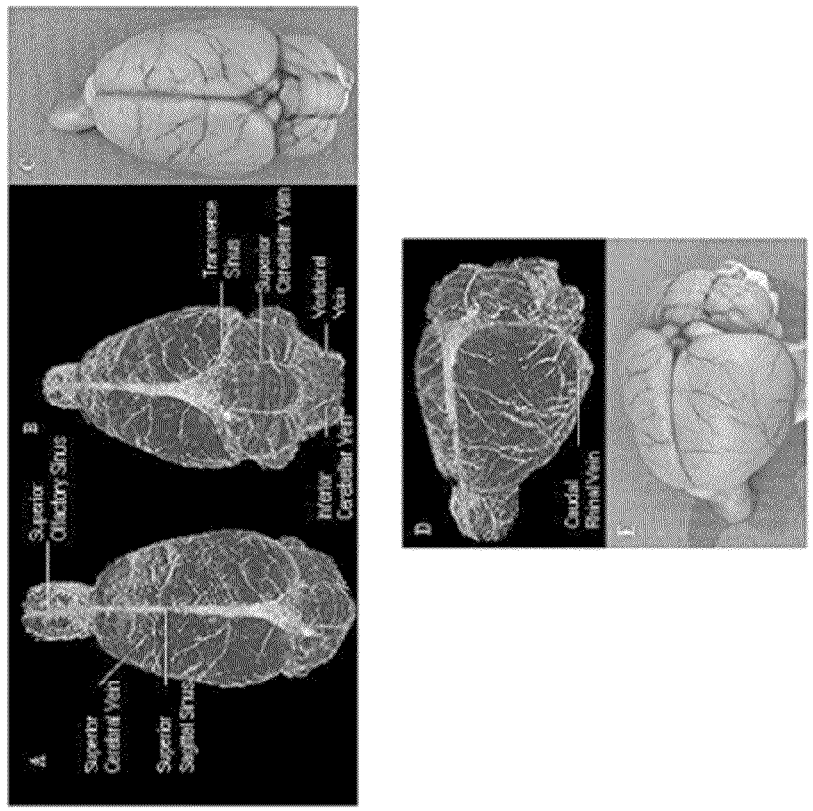
FIG. 2A is an exemplary volume rendering (VR) of three-dimensional steady-state ΔR$_2$-based, and flow-independent microscopic magnetic resonance angiography (3DΔR$_2$-mMRA) of a coronal view of a rat.
FIG. 2B is a variation of FIG. 2A having a small angular tilt that highlights the cerebellar region.
FIG. 2C is a vascular photograph corresponding to the view of FIG. 2A.
FIG. 2D is a lateral view using 3DΔR$_2$-mMRA.
FIG. 2E is a vascular photograph corresponding to the view of FIG. 2D.

The following description is merely exemplary in nature and is in no way intended to limit the disclosure, its application, or uses. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

The present disclosure includes a novel methodology for depicting small vessels, such as veins, arterioles, and venules, called 3DΔR$_2$-mMRA (three-dimensional steady-state ΔR$_2$-based, and flow-independent microscopic magnetic resonance angiography). The spin-echo-based ΔR$_2$ calculated by a fast spin-echo imaging technique before and after the injection of a contrast agent is used to map the cerebral blood volume, whose contrast is associated with the microvasculature.

A 3DΔR$_2$-based MRA method according to the present disclosure may employ 3D reconstruction techniques, and may be able to simultaneously provide high-resolution 3D information on the cerebral anatomy, in vivo microvascular architecture, and hemodynamic response, which can be used to evaluate pathological microvascular changes over time in cerebromicrovascular disease. A well-defined three-vessel occlusion model in a rat was used to evaluate the capability of the proposed method in evaluating alterations to the microvasculature.

Microvascular morphology may be delineated by calculating the difference in magnetic susceptibility between blood vessels and the surrounding tissue induced by the presence of contrast agents. See, for example, Dennie, J., Mandeville, J. B., Boxerman, J. L., Packard, S. D., Rosen, B. R. and Weisskoff, R. M., 1998, NMR imaging of changes in vascular morphology due to tumor angiogenesis, Magn Reson Med. 40, 793-799, the disclosure of which is incorporated herein by reference in its entirety. The calculation of this susceptibility effect is complex because it depends on the tissue vasculature, field strength, and types of pulse sequences and their parameters. See, for example, Weisskoff, R. M., Zuo, C. S., Boxerman, J. L. and Rosen, B. R., 1994, Microscopic susceptibility variation and transverse relaxation: theory and experiment, Magn Reson Med. 31, 601-610; and Boxerman, J. L., Hamberg, L. M., Rosen, B. R. and Weisskoff, R. M., 1995, MR contrast due to intravascular magnetic susceptibility perturbations, Magn Reson Med. 34, 555-566, the disclosures of which are incorporated herein by reference in their entirety.

Spin-echo-based $\Delta R_2$ may be associated with microvasculature, while gradient-echo-based $\Delta R_2^*$ may be sensitive to vessels of all sizes, with both parameters being independent of blood flow. A steady-state three-dimensional $\Delta R_2$-based microscopic MRA (3D$\Delta R_2$-mMRA) method according to the present disclosure may allow small vessels to be visualized and may be insensitive to flow-related artifacts.

The method may combine high-resolution 3D $\Delta R_2$ images with volume rendering (VR) or maximum intensity projection (MIP) to directly visualize the cerebromicrovasculature. The $\Delta R_2$ map, based on measurement of the spin-echo transverse relaxation rate by a fast spin-echo (FSE) imaging technique before and after the injection of a contrast agent, may be used to map the cerebral blood volume (CBV), and it changes relatively linearly with the blood volume fraction, in contrast to $\Delta R_2^*$.

Furthermore, the spin-echo-based sequence may be less sensitive to geometric distortion caused by magnetic field inhomogeneities at the air-tissue interface, and thus produces images of higher quality.

The flow-independent 3D$\Delta R_2$-mMRA method may be used to both visualize the neuromicrovascular architecture and provide information on the physiological status of the microvascular CBV. A study of the method employed both a control and a well-defined three-vessel occlusion model in the rat to evaluate the capabilities of the 3D$\Delta R_2$-mMRA method.

The transverse relaxation rate change in spin-echo ($\Delta R_2$) and regional CBV can be determined as follows. The $\Delta R_2$ value is given by $$\Delta R_2 = \frac{1}{TE} \ln\left(\frac{S_{pre}}{S_{post}}\right) \quad (1)$$

where TE is the echo time, and $S_{pre}$ and $S_{post}$ are the pre- and post-contrast signal intensities, respectively. $\Delta R_2$ varies approximately linearly with the CBV fraction; that is, $\Delta R_2 \approx k \cdot [CA] \cdot CBV$, where k is a constant that depends on the tissue type, pulse sequence, field strength, and contrast agent, and [CA] is the concentration of the contrast agent in blood.

The $\Delta R_2$ signal consists of intravascular (IV) and extravascular (EV) components. See, for example, Duong, T. Q., Yacoub, E., Adriany, G., Hu, X., Ugurbil, K. and Kim, S. G., 2003, Microvascular BOLD contribution at 4 and 7 T in the human brain: gradient-echo and spin-echo fMRI with suppression of blood effects, Magn Reson Med. 49, 1019-1027, the disclosure of which is incorporated herein by reference in its entirety. The $\Delta R_2$ IV signal exists in vessels of all sizes because the change in T2 value in blood is induced by the contrast agent, whereas the EV effect in spin-echo-based $\Delta R_2$ is associated with small vessels because the 1800 radio frequency pulse refocuses the static dephasing induced by field inhomogeneities around large vessels. See, for example, Ogawa, S., Menon, R. S., Tank, D. W., Kim, S. G., Merkle, H., Ellermann, J. M. and Ugurbil, K., 1993, Functional brain mapping by blood oxygenation level-dependent contrast magnetic resonance imaging, A comparison of signal characteristics with a biophysical model, Biophys J. 64, 803-812, the disclosure of which is incorporated herein by reference in its entirety.

The rat focal cerebral ischemia-reperfusion model was described by Lin, T. N., Sun, S. W., Cheung, W. M., Li, F. and Chang, C., 2002, Dynamic changes in cerebral blood flow and angiogenesis after transient focal cerebral ischemia in rats, Evaluation with serial magnetic resonance imaging, Stroke. 33, 2985-2991, the disclosure of which is incorporated herein by reference in its entirety. In brief, the right middle cerebral artery (MCA) of male Long-Evans rats was reversibly ligated under a stereomicroscope. Both common carotid arteries were then occluded using nontraumatic aneurysm clips. After 60 min of ischemia, arterial occlusion was released. The rectal temperature of anesthetized rats was maintained at 37.0±0.5° C. using a homeothermic blanket (Harvard, Holliston, Mass.).

Imaging may be performed on a scanner, such as a 4.7-T MR scanner (Biospec 47/40, Germany) equipped with an active shielding gradient (20 G/cm in 80 µs). Experiments may use male Long-Evan rats weighing 300-350 g. Each rat may be initially anesthetized with 5% isoflurane at an oxygenation rate of 1 L/min.

When fully anesthetized, the animal may be placed in a prone position and fitted with a custom-designed head holder inside the magnet. Isoflurane may then be maintained with 1~1.2% at 1 L/min oxygenation throughout the experiments, which causes minimal cerebral hemodynamic changes. See, for example, Lei, H., Grinberg, O., Nwaigwe, C. I., Hou, H. G., Williams, H., Swartz, H. M. and Dunn, J. F., 2001, The effects of ketamine-xylazine anesthesia on cerebral blood flow and oxygenation observed using nuclear magnetic resonance perfusion imaging and electron paramagnetic resonance oximetry, Brain Res. 913, 174-179, the disclosure of which is incorporated herein by reference in its entirety.

Images were acquired using a 72-mm birdcage transmitter coil and a separate quadrature surface coil for signal detection. To determine $\Delta R_2$, T2-weighted imaging (T2WI) was performed before and after injecting a contrast agent. The contrast agent may include superparamagnetic iron oxide nanoparticles, such as Resovist from Schering AG, Berlin, Germany at a dose of 30 mg Fe/kg.

The post-contrast image acquisition may be delayed, such as by 1-2 min, to ensure that the distribution of contrast agent in the vascular network had reached a steady state. T2WI may be performed using a 3D FSE sequence with a repetition time (TR) of 1500 ms, an effective echo time (TEeff) of 82 ms, an echo-train length (ETL) of 32, 4 averages, a field of view (FOV) of 2.8×2.8×1.4 cm, and an acquisition matrix of 256× 256×96 (which may be zero-padded to 512×512×192). The in-plane resolution and slice thickness may be 54.68 and 72.91 µm, respectively. TOF-MRA may be performed using FLASH (fast low-angle shot) with a TR of 30 ms, a TE of 10 ms, a flip angle of 30°, and with the same FOV and matrix size as for the 3D$\Delta R_2$-mMRA method.

The 3D whole-brain precontrast images may be coregistered with the postcontrast images using a coregistration algorithm. For example, the algorithm may be implemented using a function of Normalized Mutual Information with the Rigid transform in Amira software (TGS, San Diego, Calif.). Both pre- and postcontrast rat brain images may be manually trimmed to exclude nonbrain structures. An $\Delta R_2$ map according to equation (1) may be calculated on a pixel-by-pixel basis, such as with custom software written in a programming language such as Matlab (MathWorks, Natick, Mass.). The 3D$\Delta R_2$-mMRA method may include constructing high-resolution 3D $\Delta R_2$ maps using a VR or MIP utility (Amira, TGS).

Figure 1:
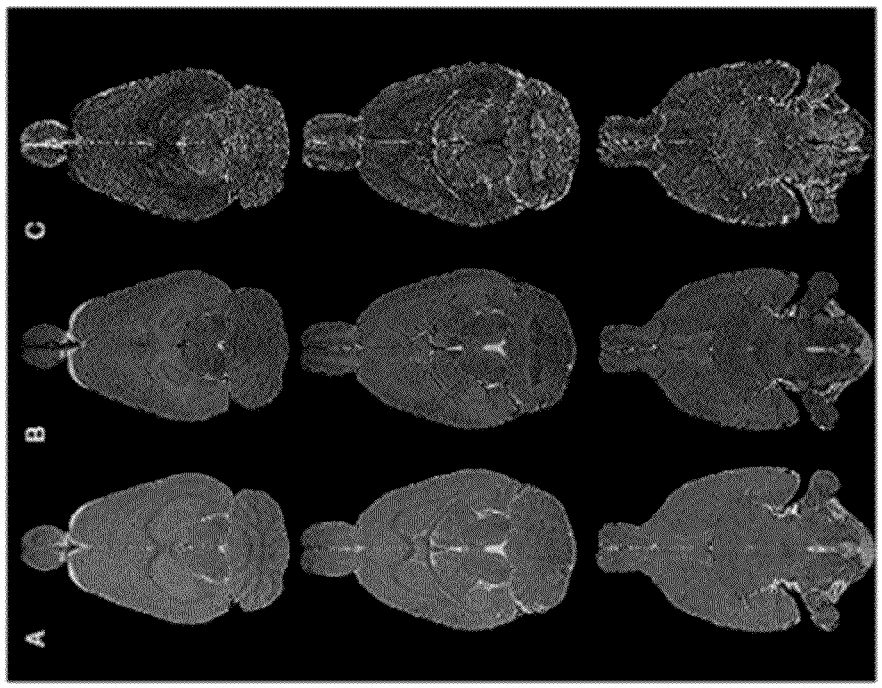
FIG. 1A is an exemplary pre-contrast high-resolution T2-weighted imaging (T2WI) view of a coronal view of a rat brain.
FIG. 1B is an exemplary post-contrast high-resolution T2WI view of a coronal view of a rat brain.
FIG. 1C is an exemplary calculated ΔR$_2$ map of a coronal view of a rat brain.

Referring now to FIG. 1, coronal $\Delta R_2$ images with an in-plane resolution of 54.68 µm and a through-plane resolution of 72.91 µm (FIG. 1C) obtained from different locations of an entire 3D data set that was calculated from precontrast (FIG. 1A) and postcontrast (FIG. 1B) T2WI images according to equation (1) are shown. The coronal views are from a high-resolution T2WI of a rat brain from an entire 3D data set (54×54×72 μm), where the Resovist dose was 30 mg/kg.

Hyperintensities within vessels in the $\Delta R_2$ map may be caused by the contrast-agent-related susceptibility effect. 3D$\Delta R_2$-mMRA may be performed by reconstructing high-resolution 3D $\Delta R_2$ images using a VR technique, as shown in coronal (FIGS. 2A & 2B) and lateral (FIG. 2D) views. Veins as well as all major venous sinuses and their ramifications were clearly visible on the brain surface.

These vessels were further validated and identified in accordance with the cerebral vascular atlas in the coronal and lateral views as follows: superior olfactory sinus, superior cerebral veins, superior sagittal sinus, and caudal rhinal vein in the cerebrum; superior cerebellar vein, inferior cerebellar vein, and vertebral vein in the cerebellum; and the transverse sinus in the border between the cerebrum and cerebellum. See, for example, Scremin, O. U., 1995, Cerebral vascular system, In: Paxions, G (Ed), The Rat Nervous System, Academic Press, San Diego, pp. 3-35; and Dorr, A., Sled, J. G. and Kabani, N., 2007, Three-dimensional cerebral vasculature of the CBA mouse brain: a magnetic resonance imaging and micro computed tomography study, Neuroimage 35, 1409-1423, the disclosure of which is incorporated herein by reference in its entirety.

The vessels on the brain surface were well correlated with vascular photographs of dorsal-bird and lateral views (FIGS. 2C & 2E) in the same rat. Major arteries such as the MCA may not be clearly evident in 3D$\Delta R_2$-mMRA because the arterial signal was dephased by the high flow rate in precontrast T2WI with a long TE, which resulted in no or only minimal differences between pre- and postcontrast images of arteries.

Figure 3:
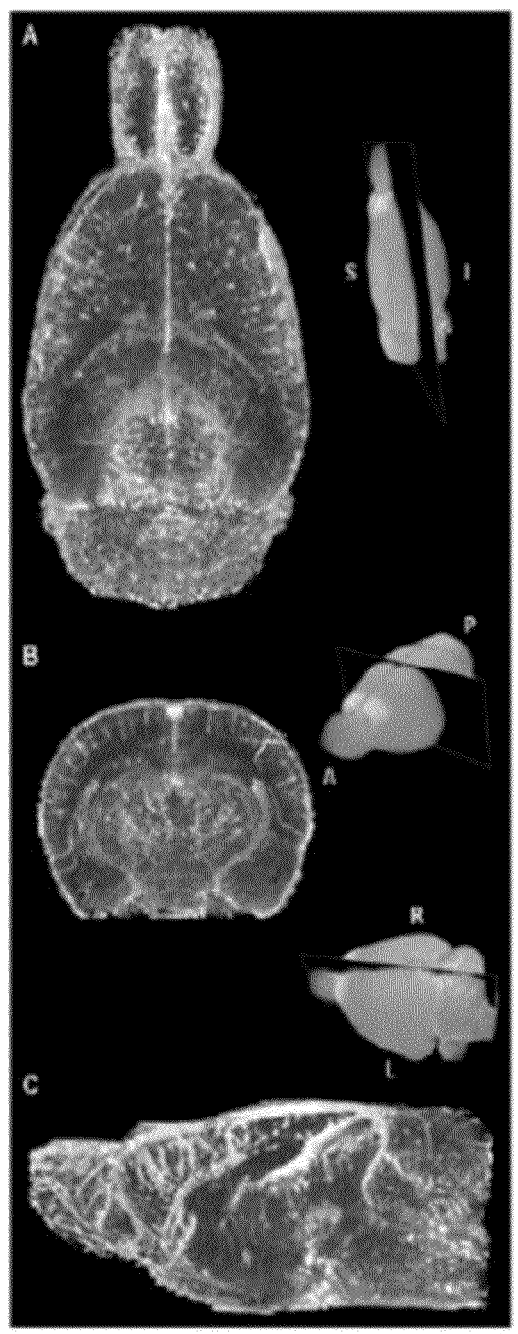
FIGS. 3A-3C depict three orthogonal views of the architecture of small vessels including arterioles and venules inside the brain.

The architecture of small vessels including arterioles and venules inside the brain could be delineated by rendering $\Delta R_2$-mMRA along the three orthogonal views (FIG. 3), which illustrated the rich and complicated small-vessel structure in the brain, including the superficial intracortical and the deeper subcortical microvasculature. FIG. 3A depicts a coronal slice plane, superior-to-inferior view (S-I). FIG. 3B depicts an axial slice plane, anterior-to-posterior view (A-P). FIG. 3C depicts a sagittal slice plane, left-to-right view (L-R). These results demonstrate the capability of the proposed method in visualizing small vessels.

Figure 4:
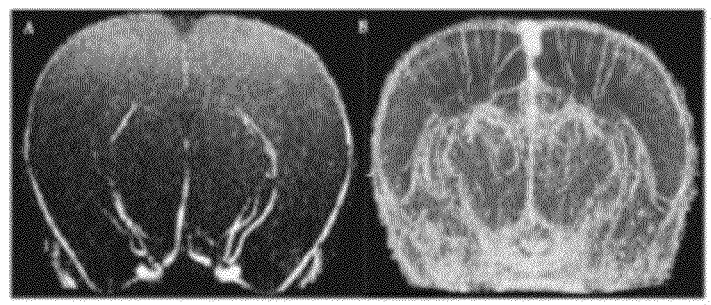
FIG. 4A is an exemplary visualization of microvasculature according to the present disclosure.
FIG. 4B is an exemplary visualization of microvasculature according to time-of-flight MRA.

FIG. 4 compares visualizations of the microvasculature between the presented method (FIG. 4B) and the TOF-MRA method (FIG. 4A). The images for these two methods were acquired from the same data set with an identical axial view, slab position, and image resolution. The figure indicates that many of the small vessels were more visible in 3D$\Delta R_2$-mMRA, with only major arteries being evident in TOF-MRA.

A three-vessel occlusion stroke model was used to validate the capability of 3D$\Delta R_2$-mMRA in evaluating alterations to the microvasculature.

Figure 5:
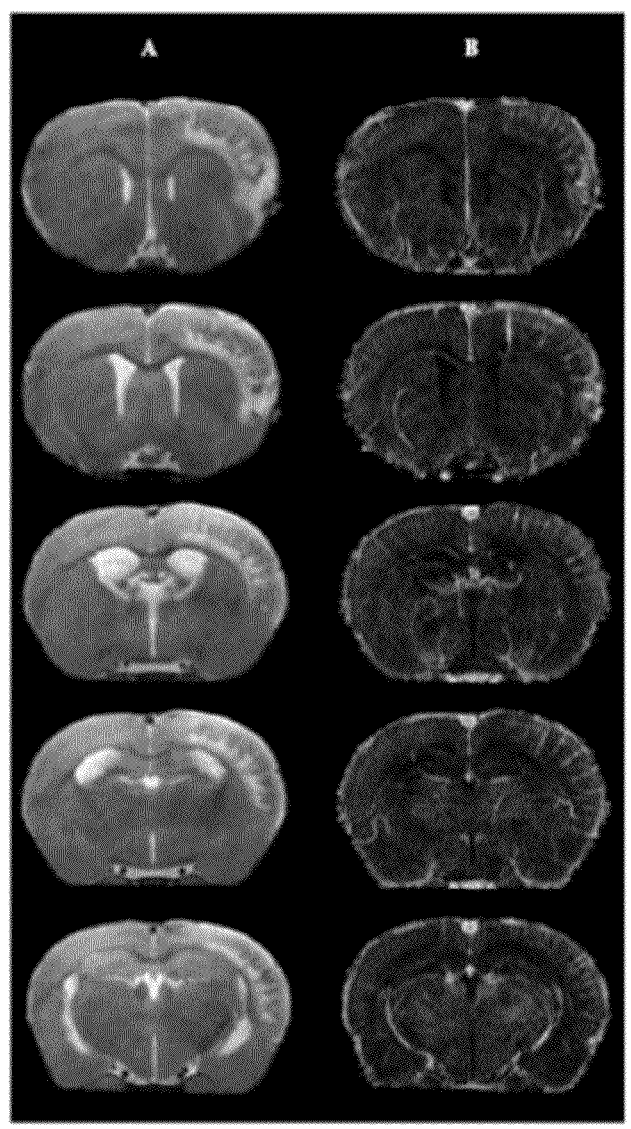
FIG. 5A shows exemplary axial T2WI images at different locations with an in-plane resolution of 54.68 μm and a slice thickness of 500 μm obtained from a 3D data set at 7 days after the reperfusion of a rat subjected to 60 min of MCA occlusion.
FIG. 5B shows an exemplary volume rendering (VR) of 3DΔR$_2$-mMRA for the same slice positions as in FIG. 5A.

FIG. 5A shows axial T2WI images at different locations with an in-plane resolution of 54.68 μm and a slice thickness of 500 μm obtained from a 3D data set at 7 days after the reperfusion of a rat subjected to 60 min of MCA occlusion. The T2WI pattern in the ischemic right MCA cortex at day 7 after reperfusion was consistent with that in our previous study, which also documented microvascular remodeling.

FIG. 5B shows the VR of 3D$\Delta R_2$-mMRA for the same slice position as in FIG. 5A. A much capillary-like brighter signal extending from the leptomeninges into the cortex were evident within the ischemic right MCA cortex, which agrees with the previous finding of an increased CBV and cerebral blood flow (CBF). FIG. 5A is an axial view of high-resolution T2WI depicting the infarct region in the right cortex in a three-vessel occlusion ischemia model of the rat with a thickness of 0.5 mm taken from different blocks of the entire 3D data set. FIG. 5B is a 3D$\Delta R_2$-mMRA view at the same position as FIG. 5A showing the change in vascular morphology due to ischemia-induced angiogenesis within the infarct region.

Many studies have assessed the macro- and microvascular structure and function in cerebrovascular disease using either MR perfusion to measure the hemodynamic parameters of CBV, CBF, and permeability, such as in dynamic contrast-enhanced MR imaging, or MRA techniques such as TOF- and CE-MRA to visualize the vasculature. See, for example, Kastrup, A., Engelhorn, T., Beaulieu, C., de Crespigny, A. and Moseley, M. E., 1999, Dynamics of cerebral injury, perfusion, and blood-brain barrier changes after temporary and permanent middle cerebral artery occlusion in the rat, J. Neurol Sci. 166, 91-99), the disclosure of which is incorporated herein by reference in its entirety.

The present disclosure includes a new approach of CBV-based microscopic MRA (3D$\Delta R_2$-mMRA), which may be able to simultaneously reveal the morphology of the microvasculature and elucidate the physiological status of microvascular CBV. This technique may greatly enhance the understanding of the development and treatment of cerebrovascular diseases such as strokes and brain tumors.

The 3D$\Delta R_2$-mMRA can be used to visualize both large vessels (e.g., veins and in sinuses, though with the exception of arteries) and small vessels (e.g., arterioles and venules) (FIGS. 2 & 3). This may be due to the spin-echo-based $\Delta R_2$ signal mainly consisting of IV and EV components. The specificity and sensitivity of IV and EV effects for various vessel sizes in gradient-echo- and spin-echo-based sequences have been described previously.

Briefly, the IV effect from spin-echo-based $\Delta R_2$ occurs in vessels of all sizes, but it may be small within very large arteries due to the presence of a high flow rate, and the EV effect of $\Delta R_2$ is associated with capillaries, which generally have diameters of less than 10 μm. The in-plane resolution of the proposed method may reach 54 μm with a total acquisition time of 76 min by using a 3D FSE sequence with an ETL of 32.

Although this resolution is still larger than capillary diameters, it may be improved by increasing the imaging sensitivity in combination with an increased matrix size and reduced FOV by using other rapid acquisition techniques such as parallel imaging or a more sophisticated coil design. For examples of parallel imaging, see Madore, B. and Pelc, N.J., 2001, SMASH and SENSE: experimental and numerical comparisons, Magn Reson Med. 45, 1103-1111), the disclosure of which is incorporated herein by reference in its entirety. For examples of sophisticated coil designs, see Logothetis, N., Merkle, H., Augath, M., Trinath, T. and Ugurbil, K., 2002, Ultra high-resolution fMRI in monkeys with implanted RF coils, Neuron. 35, 227-242; and Lee, H. L., Lin, I. T., Chen, J. H., Horng, H. E. and Yang, H. C., 2005, High-T-c superconducting receiving coils for nuclear magnetic resonance imaging, IEEE Transactions on Applied Superconductivity. 15, 1326-1329, the disclosures of which are incorporated herein by reference in their entirety.

The contrast of conventional TOF-MRA is sensitive to the rapidly inflowing spins in arteries. This means that TOF-MRA may be unsuitable to identify small vessels with slow-moving spins in leptomeningeal communicating shunts and intracortical arterioles and venules, whereas this is possible with 3D$\Delta R_2$-mMRA (FIG. 4).

In addition, TOF-MRA signal cancellation may occur when a wide range of flow velocities exists within imaging voxels, such as due to turbulent flow. 3DΔR$_2$-mMRA is based on calculating the susceptibility effect, which is independent of the blood flow and thus insensitive to the flow-related artifact. See, for example, Kouwenhoven, M., 1997, Contrast-enhanced MR angiography, Methods, limitations and possibilities, Acta Radiol. Suppl. 412, 57-67, the disclosure of which is incorporated herein by reference in its entirety.

TOF-MRA has been used to successfully evaluate MCA vascular occlusion and reperfusion. See, for example, Beckmann, N., Stirnimann, R. and Bochelen, D., 1999, High-resolution magnetic resonance angiography of the mouse brain: application to murine focal cerebral ischemia models. J Magn Reson. 140, 442-450, the disclosure of which is incorporated herein by reference in its entirety. TOF-MRA might not be suitable for investigating postischemic angiographic processes over time after reperfusion due to its limited ability to visualize small vessels.

Vascular photographs from a dorsal-bird view are commonly used to evaluate morphological changes on the brain surface in postischemic angiogenesis. However, the intracortical microvascular remodeling within a lesion side (rather than on the brain surface) is very difficult to visualize by vascular photography. Furthermore, it is difficult to examine an ischemic area immunohistologically due to liquefaction of brain tissue within an infarct region, especially more than 3 days after reperfusion.

The changes in CBV and CBF measured by perfusion MR imaging within an infarct region in the chronic stage of ischemia have been documented. Although information on microvascular perfusion can be described by both of CBV and CBF, individual vessels cannot be discerned. The 3DΔR$_2$-mMRA technique according to the principles of the present disclosure visualizes small vessels with high contrast and provides relative CBV mapping are able to simultaneously observe the morphological and hemodynamic changes in microvascular remodeling over time.

The 3DΔR$_2$-mMRA may reveal hyperintensities in the ipsilateral cortex after transient ischemia (FIG. 5), suggesting an increase in CBV as reported previously. 3DΔR$_2$-mMRA produced high-resolution images of capillaries extending from the leptomeninges into the cortex within the ischemic cortex. It is very likely that the newly formed capillaries were from the leptomeninges. This is the first MRA method that can, in various implementations, reveal in vivo microangiographic processes in an ischemia model. This method may be capable of tracing angiogenesis at different disease stages even in the presence of strong tissue necrosis within the lesion area.

Another method based on gradient-echo images using the subtraction of pre- and postcontrast T2*-weighted images (rather than computing ΔR$_2$*) has been proposed for microangiography. See, for example, Bolan, P. J., Yacoub, E., Garwood, M., Ugurbil, K. and Harel, N., 2006, In vivo micro-MRI of intracortical neurovasculature, Neuroimage. 32, 62-69, the disclosure of which is incorporated herein by reference in its entirety. However, its contrast is due to dephasing of both intra- and extravascular signals due to the susceptibility effect without compensation, which is a major source of image artifacts and overestimates vessel lumen sizes.

Furthermore, the vasculature in the brain region cannot be delineated when there are strong magnetic-field inhomogeneities, such as in the amygdala, which is near to an air-tissue interface. The 3DΔR$_2$-mMRA method, which computes the spin-echo-based ΔR$_2$, is robust to those problems because it utilizes the spin-echo image with a refocus pulse that is highly tolerant of artifacts from off-resonance effects such as inhomogeneities of the main magnetic field and magnetic susceptibility variation, especially those that result from discontinuities in tissue properties.

The relative CBV is proportional to the ΔR$_2$ value. See, for example, Wu, E. X., Wong, K. K., Andrassy, M. and Tang, H., 2003, High-resolution in vivo CBV mapping with MRI in wild-type mice, Magn Reson Med. 49, 765-770; and Dunn, J. F., Roche, M. A., Springett, R., Abajian, M., Merlis, J., Daghlian, C. P., Lu, S. Y. and Makki, M., 2004, Monitoring angiogenesis in brain using steady-state quantification of DeltaR2 with MION infusion, Magn Reson Med. 51, 55-61, the disclosures of which are incorporated herein by reference in their entirety. However, the relative CBV can only be accurately measured when the contrast agent is in a steady-state condition in IV space.

Figure 6:
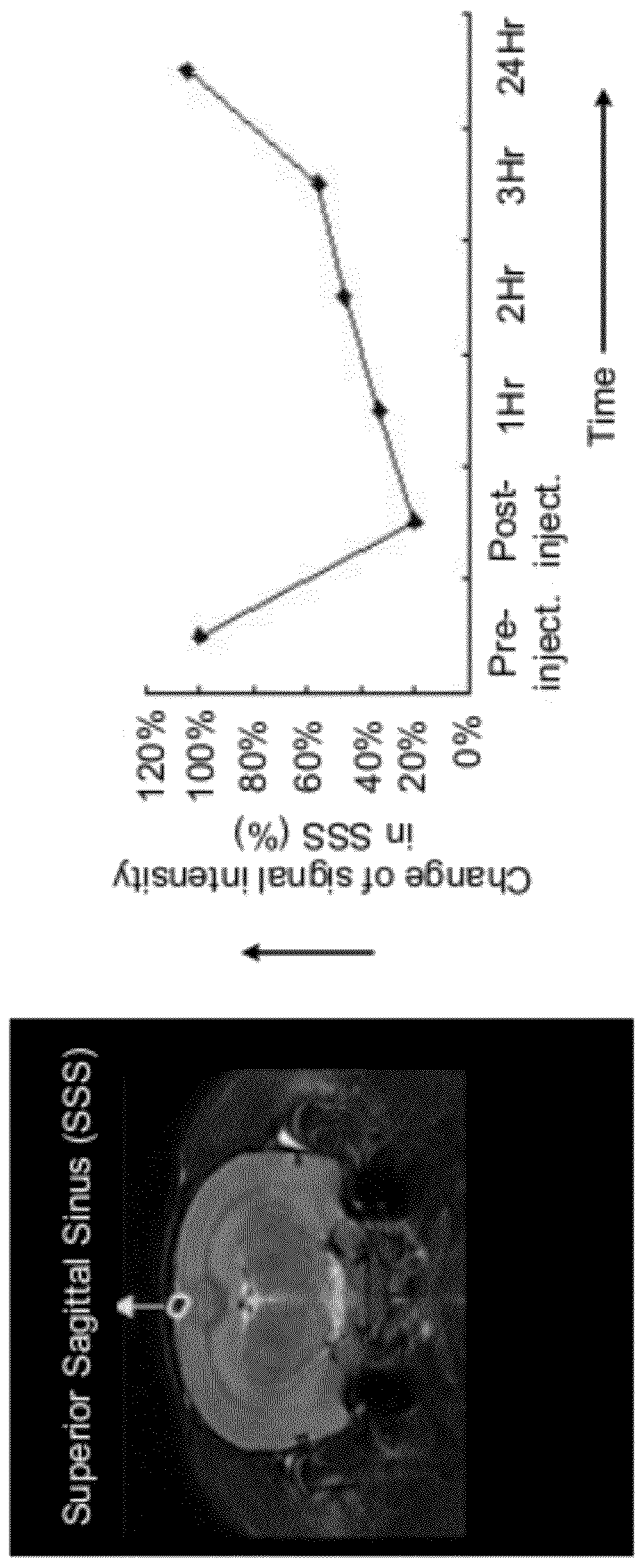
FIG. 6 shows exemplary signal intensities in a brain vessel of the superior sagittal sinus prior to and after the injection of Resovist.

FIG. 6 shows the signal intensities in a brain vessel of the superior sagittal sinus prior to and after the injection of Resovist. Other contrast agents may be used, and these measurements may be made with that contrast agent. FIG. 6 shows temporal signal changes in T2WI within a blood vessel of the superior sagittal sinus. The T2WI image was obtained with an FSE sequence with TR=4000 ms and TE=70 ms.

The image intensity falls off rapidly (from 100% to 20%) immediately after the injection of Resovist, and then becomes relatively stable with a small linear increase during the first 3 hours (from 35% to 55%). The acquisition time for 3DΔR$_2$-mMRA may be 76 min, at which time the Resovist was stable distributed and circulated within the blood vessels. Specialized contrast agents with high-relaxivity and a prolonged half-life in vessels may help to increase the microvasculature visibility when using contrast agents at lower concentrations in 3DΔR$_2$-mMRA.

According to the principles of the present disclosure, a steady-state ΔR$_2$-based and flow-independent microscopic MRA method combined with 3D image reconstruction techniques for the in vivo visualization of the architecture of small vessels is possible. The method was validated by applying it to a rat brain. The method may simultaneously provide high-resolution 3D information on the cerebral anatomy, in vivo microvascular architecture, and CBV mapping, which can be used to evaluate pathological microvascular changes over time. The technique may be used as a routine tool for examining the microvasculature in small-animal models and clinical patients who are either healthy or who are affected by cerebrovascular disease.

Additionally, tumor-associated microvascular changes offer important new insight into how tumors grow and respond to treatment. The 3DΔR2-mMRA disclosed herein can be used for in-vivo visualization of brain tumor angiogenesis. For example, when the 3DΔR2-mMRA is used in ethylnitrosourea (ENU)-induced rat brain tumor model, changes in microvascular morphology and function can be simultaneously assessed at different stages of a tumor. For ENU-induced rat brain tumor model, see Jang et al., *J Neurosurgery*, 108:782-790, 2008, which is incorporated herein by reference in its entirety.

Tumor angiogenesis has been recognized as a key element in the pathophysiology of tumor growth and metastasis. The abnormality of microvascular morphology has been used to distinguish benign brain tumors from malignant brain tumors. See, Bullitt et al., *Acad Radiol.* 12(10):1232-1240, 2005, which is incorporated herein by reference in its entirety. Blood flow and blood volume information, however, are important for understanding the tumor physiology and can be valuable in selecting and evaluating therapies. Therefore, simultaneously monitoring functional and structural changes to tumor microvasculature can provide an effective assessment of both tumor aggressiveness and treatment efficacy.

Many studies have reportedly assessed the vascular structure and function in brain tumor using either MRA techniques to visualize the vasculature or MR perfusion method to measure the hemodynamic parameters of cerebral blood volume (CBV), blood flow, and permeability. See, for example, Bullitt et al., NeuroImage. 37:S116-119, 2007, which is incorporated herein by reference in its entirety. However, none of the currently available methods can visualize the vasculature and measure the hemodynamic parameters simultaneously. Furthermore, current MRA methods such as time-of-flight (TOF) and contrast-enhanced (CE) MRA can evaluate only larger arteries and veins but not the microvasculature of tumors.

As described below in detail, the 3DΔR2-mMRA disclosed herein can be used to assess the microvascular function and structure in both normal and ischemia rats. See, for example, Lin et al., Proceeding of ISMRM 812, 2008, which is incorporated herein by reference in its entirety. Further, experiments performed on ENU-induced rat brain tumor model show that high-resolution 3DΔR2-mMRA can be used to simultaneously characterize relationships between tumor growth and changes in vascular morphology and CBV.

In the experiments, a brain tumor model was created by chemical induction. Pregnant Sprague-Dawley (SD) rats were initially placed in a restrainer and injected i.p. with 50 mg/kg ENU (Sigma, St Louis, Mo., USA) at gestation day 18 to day 19 using a 26-gauge needle. Pups were housed two per cage (same sex) after weaning and observed weekly for signs of illness.

An offspring of ENU-injected pregnant SD rat underwent imaging at postnatal day 72, 145, and 199. The rat was initially anesthetized with 5% isoflurane at 1 L/min air flow. When fully anesthetized, the animal was placed in a prone position and fitted with a custom-designed head holder inside the magnet. Isoflurane was then maintained with 1~1.2% at 1 L/min air flow throughout the experiments. Images were acquired using a 72-mm birdcage transmitter coil and a separate quadrature surface coil for signal detection.

To determine $\Delta R_2$, T2-weighted images (T2WI) were performed before and after an injection of iron oxide (Resovist, Schering AG, Berlin, Germany) at a dose of 30 mg Fe/kg. The post-contrast image acquisition was delayed by 1-2 minutes for ensuring a steady-state distribution of contrast agent in the vascular network.

T2WI were acquired using 3D RARE sequence with a TR of 1500 ms, TEeff of 82 ms, ETL of 32, 4 averages, FOV=2.8 cm×2.8 cm×1.4 cm, acquisition matrix=256×256×96 (zero-padded to 512×512×192). The in-plane resolution and slice thickness were 54.68 and 72.91 µm, respectively.

$\Delta R_2$ map was calculated pixel-by-pixel using software written by Matlab (MathWorks, Natick, Mass., USA). A 3D view of microvasculature was constructed with 3D ΔR2 map using a volume-rendering utility (TGS, Amira, San Diego, Calif.).

FIG. 7 shows images taken using a 4.7-T Biospec 47/40 MR scanner with an active shielding gradient. FIGS. 7A-7C show T2WI, ΔR2, and 3DΔR2-mMRA in normal and magnified view of a section of rat brain in the tumor area as a function of time, respectively. FIGS. 7D and 7E show quantitative analysis of tumor volume and ΔR2 value of whole tumor, respectively.

Figure 7A:
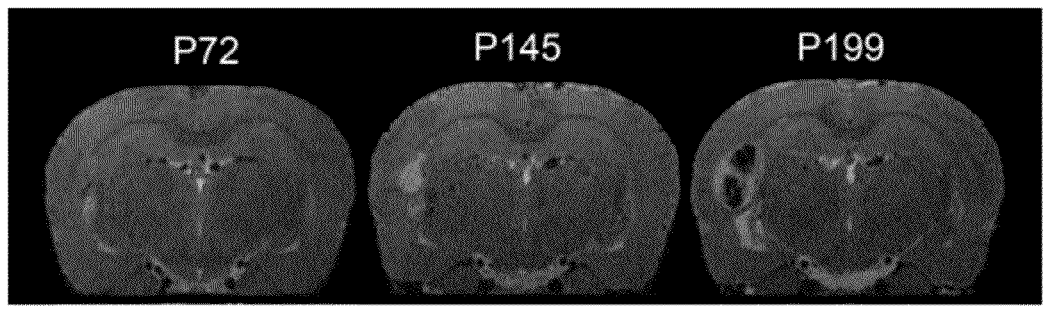
FIGS. 7A-7C depict temporal changes in T2WI, ΔR$_2$, and normal and magnified views of 3DΔR$_2$-mMRA of an ethylnitrosourea (UNE)-induced rat brain tumor.
Figure 7B:
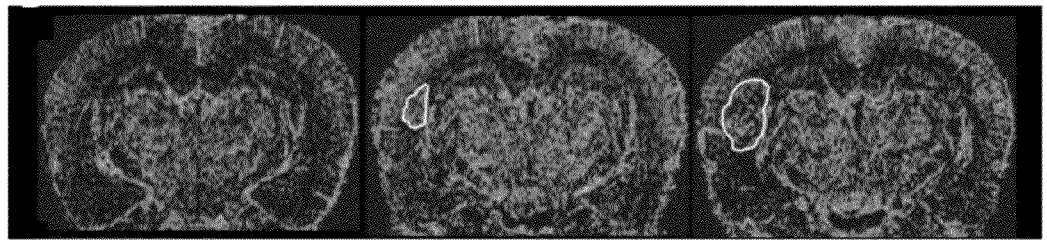
Figure 7C:
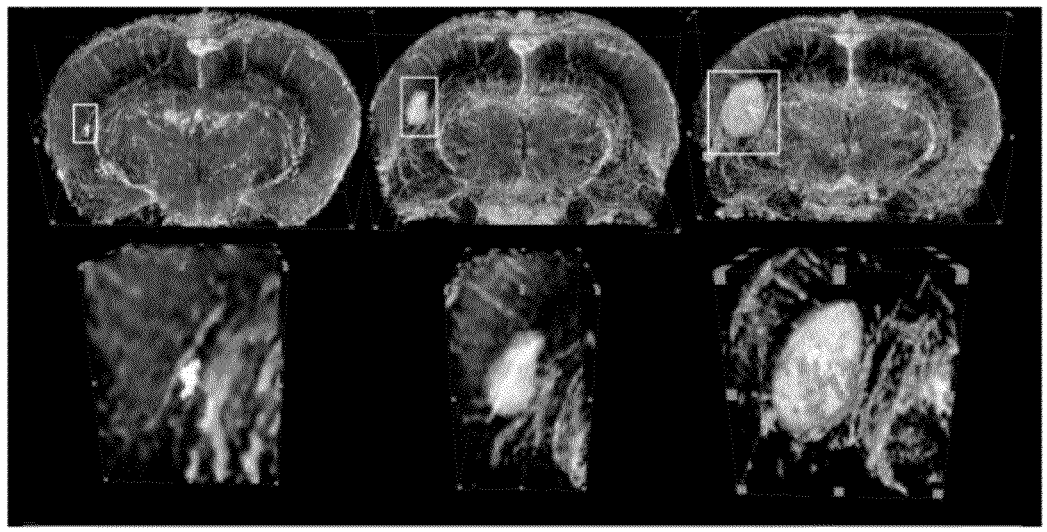

More specifically, FIGS. 7A-7C show temporal changes in T2WI, ΔR2, and normal and magnified views of 3DΔR2-mMRA. The hyperintensity of T2WI indicated tumor region. Tumor location, growth, and heterogeneity can be observed by T2WI. The hypointensity area within tumor in T2WI at late stage (P199) may be due to tumor hemorrhage.

Figure 7D:
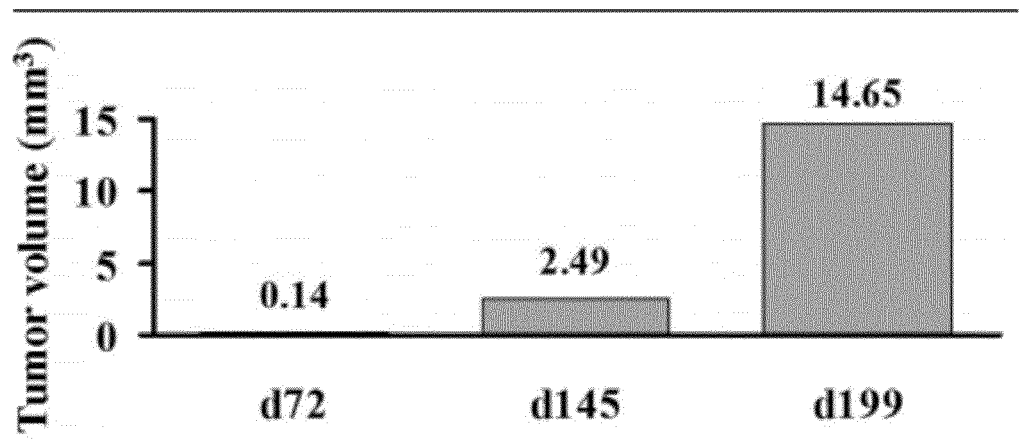
FIG. 7D shows quantitative analysis of tumor volume of the brain tumor.

FIG. 7D shows that tumor volume was substantially increased after P145. Vessels appear bright in ΔR2 map owing to signal difference around the vessels prior to and after injecting the contrast agent. It reflects the physiological status of the microvascular CBV.

Figure 7E:
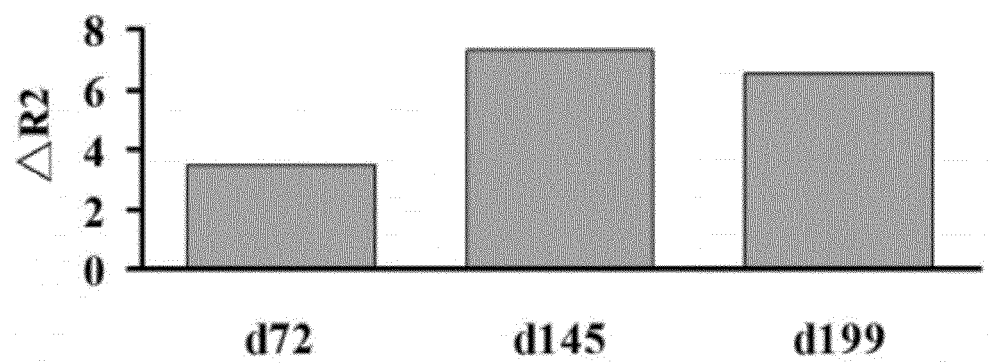
FIG. 7E shows quantitative analysis of ΔR$_2$ value of the brain tumor.

FIG. 7E shows quantitative analysis that demonstrated that a substantial increase in ΔR2 within tumor area was observed after P145. Notably, the signal enhancement was mainly located in tumor core region at P199 (see FIG. 7B). In order to observe the change of microvasculature within tumor, the volume rendering of whole tumor was constructed by outlining the tumor region from entire 3D T2WI and fused with 3DΔR2-mMRA. A gradually increase in vessel size and density from P72 to P199 was observed, suggesting high angiogenic activity.

Thus, according to the principles of the present disclosure, the 3DΔR2-mMRA can simultaneously monitor the changes in microvascular structure and function associated with tumor angiogenesis at different stages that can provide new insights into the tumor growth and metastasis.

Figure 8:
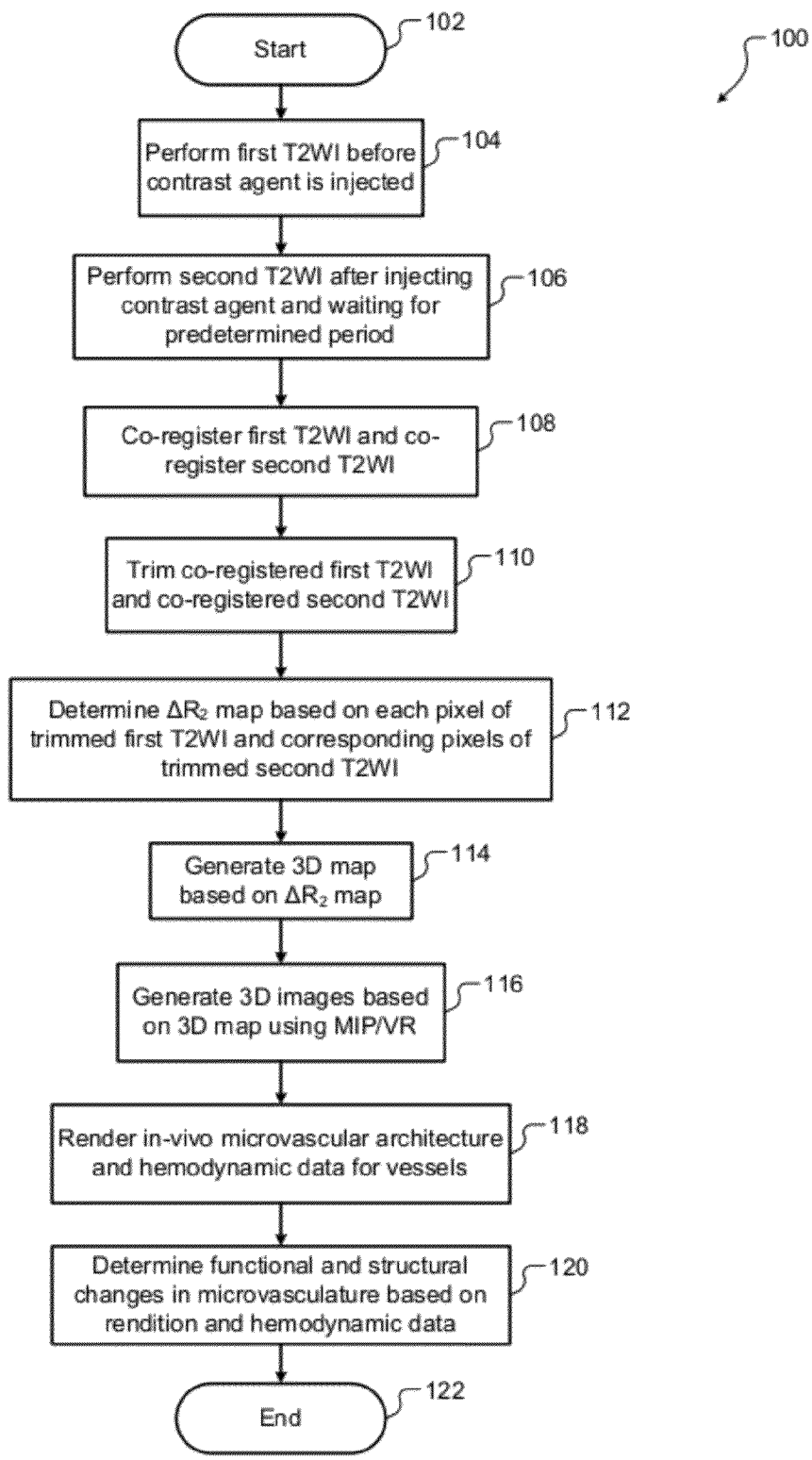
FIG. 8 is a flowchart depicting steps of a method for rendering 3D images of in-vivo microvascular architecture and generating hemodynamic data for vessels using 3DΔR$_2$-mMRA.

FIG. 8 shows a flowchart of a method 100 for rendering 3D images of in-vivo microvascular architecture and generating hemodynamic data for vessels using 3DΔR$_2$-mMRA is shown. Control begins in step 102. In step 104, control performs a first T2WI on a subject and generates first T2WI before contrast agent is injected in the subject. When the subject is injected with the contrast agent, control performs a second T2WI on the subject after waiting for a predetermined period and generates second T2WI in step 106. In step 108, control co-registers first T2WI and second T2WI and generates co-registered first T2WI and co-registered second T2WI, respectively. In step 110, control trims co-registered first T2WI and co-registered second T2WI to generate trimmed first T2WI and trimmed second T2WI, respectively.

In step 112, control determines a $\Delta R_2$ map based on each pixel of the trimmed first T2WI and corresponding pixels of the trimmed second T2WI. Control constructs a 3D map based on the $\Delta R_2$ map in step 114. Control generates 3D images based on the 3D map using MIP and/or VR in step 116. In the 3D images, control renders in-vivo microvascular architecture and hemodynamic data for vessels of the subject in step 118. In step 120, the rendition and the hemodynamic parameters can be used to determine functional and structural changes in microvasculature (e.g., in tumors). Control ends in step 122.

Figure 9:
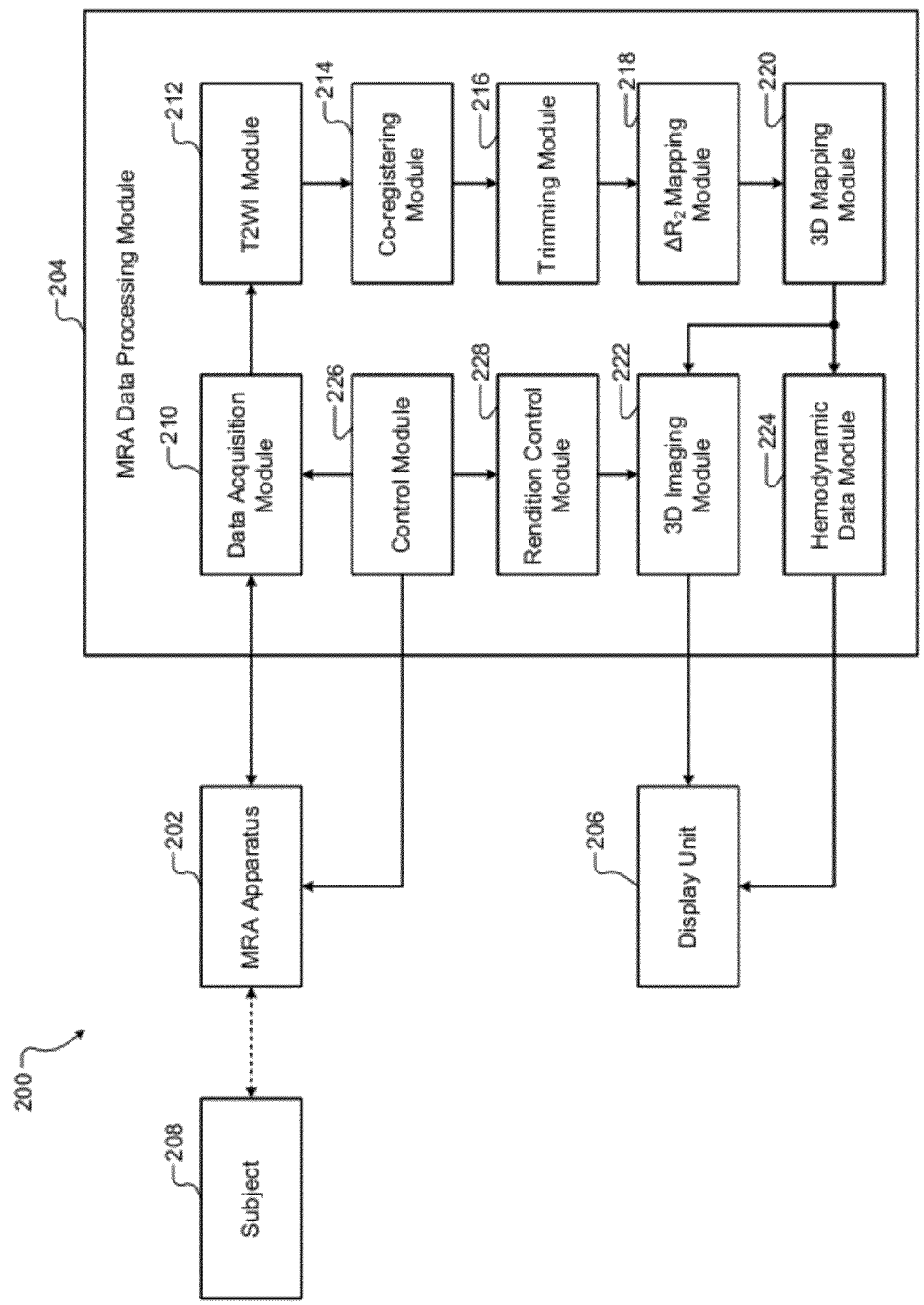
FIG. 9 is a functional block diagram of a system for rendering 3D images of in-vivo microvascular architecture and generating hemodynamic data for vessels using 3DΔR$_2$-mMRA.

FIG. 9 shows a functional block diagram of an exemplary system 200 for rendering 3D images of in-vivo microvascular architecture and generating hemodynamic data for vessels using 3DΔR$_2$-mMRA. The system 200 comprises an MRA apparatus 202, an MRA data processing module 204, and a display unit 206. The MRA apparatus 202 probes a subject 208. A user (not shown) controls the MRA apparatus 202 by providing inputs to the MRA apparatus 202 via the MRA data processing module 204. Additionally, the user injects a contrast agent into the subject 208 during the probe. The MRA data processing module 204 processes data acquired from the MRA apparatus 202 and displays 3D images and other data including hemodynamic parameters on the display unit 206. The user interprets information displayed on the display unit 206 and diagnoses condition of the subject 208.

The MRA data processing module 204 comprises a data acquisition module 210, a T2WI module 212, a co-registering module 214, a trimming module 216, a $\Delta R_2$ mapping module 218, a 3D mapping module 220, a 3D imaging module 222, a hemodynamic data module 224, a control module 226, and a rendition control module 228. The control module 226 may include a user interface (not shown) that allows the user to input commands and control the MRA apparatus 202.

The data acquisition module 210 acquires data for the subject 208 from the MRA apparatus 202. The T2WI module 212, the co-registering module 214, the trimming module 216, the $\Delta R_2$ mapping module 218, the 3D mapping module 220, and 3D imaging module 222, the hemodynamic data module 224, and the rendition control module 228 perform 3D$\Delta R_2$-mMRA. The control module 226 controls the MRA apparatus 202 and the 3D$\Delta R_2$-mMRA. The display unit 206 displays outputs generated by 3D$\Delta R_2$-mMRA. The outputs include 3D images of microvascular architecture and hemodynamic data of vessels of the subject 208 generated simultaneously by 3D$\Delta R_2$-mMRA.

The T2WI module 212 performs a first T2WI on the data received from the MRA apparatus 202 before the subject 208 is injected with a contrast agent and generates a first T2WI data. The T2WI module 212 performs a second T2WI and generates a second T2WI data when a predetermined time elapses after the subject 208 is injected with the contrast agent. The co-registering module 214 co-registers the first T2WI data and the second T2WI data. The co-registering module 214 generates co-registered first T2WI data and co-registered second T2WI data. The trimming module 216 trims the co-registered first T2WI data and the co-registered second T2WI data. The trimming module 216 generates trimmed first T2WI data and trimmed second T2WI data.

The $\Delta R_2$ mapping module 218 generates a $\Delta R_2$ map based on each pixel of the trimmed first T2WI and corresponding pixels of the trimmed second T2WI. The 3D mapping module 220 generates a 3D map based on the $\Delta R_2$ map. The 3D imaging module 222 generates 3D images of vessels of the subject 208 based on the 3D map. The vessels include at least one of veins, sinuses, arterioles, venules, and capillaries. The 3D imaging module 222 generates the 3D images based on 3D$\Delta R_2$-mMRA. The 3D imaging module 222 generates the 3D images without sensitivity to flow of matter (e.g., blood) through the vessels. The 3D images render in-vivo microvascular architecture of the vessels.

Additionally, the hemodynamic data module 224 generates hemodynamic data including microvascular fluid volume data for the vessels based on the 3D map. The display unit 206 displays the microvascular architecture and the hemodynamic data in the 3D images. The rendition control module 228 controls the rendition of the microvascular architecture and the hemodynamic data in the 3D images using at least one of maximum intensity projection and volume rendering.

The control module 226 controls resolution of the 3D images by controlling one or more aspects of the MRA apparatus 202. For example, the control module 226 controls the resolution by controlling imaging sensitivity of the MRA apparatus 202. The control module 226 controls the resolution by controlling field of view of the MRA apparatus 202. The control module 226 controls the resolution by controlling refocus pulse of the MRA apparatus 202. Additionally or alternatively, the control module 226 controls the resolution by controlling a size of an acquisition matrix used by the data acquisition module 210.

The 3D$\Delta R_2$-mMRA offers may benefits. For example, the 3D imaging module 222 can render at least one of intracortical and subcortical microvasculature of the vessels in the 3D images. The 3D imaging module 222 can generate renditions of at least one of intracortical arterioles and intracortical venules with slow-moving spins in the subject 208. The 3D imaging module 222 generates the 3D images based on a magnetic susceptibility effect that is insensitive to flow-related artifacts including at least one of turbulent and pulsatile flows through the vessels. The 3D imaging module 222 generates the 3D images without sensitivity to a geometric distortion caused by magnetic field inhomogeneities at an air-tissue interface in the subject 208. The 3D imaging module 222 generates the 3D images without sensitivity to changes in magnetic susceptibility caused by discontinuities in tissue properties in the subject 208. The 3D imaging module 222 generates the 3D images that can reveal in-vivo microangiographic processes in ischemia in the subject 208. The 3D imaging module 222 generates the 3D images that can indicate angiogenesis in a lesion area in the subject in presence of tissue necrosis in the lesion area.

Additionally, the 3D imaging module 222 can render 3D images of microvasculature of a tumor in the subject 208, and the hemodynamic data module 224 can simultaneously measure hemodynamic parameters associated with the tumor using 3D$\Delta R_2$-mMRA. Accordingly, functional and structural changes in the microvasculature can be readily determined based on the 3D images and the hemodynamic parameters generated by 3D$\Delta R_2$-mMRA.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A method comprising:
    performing a first T2-weighted imaging (T2WI) on a subject;
    injecting said subject with a contrast agent after performing said first T2WI;
    waiting a predetermined period of time before performing a second T2WI on said subject;
    co-registering said first T2WI and said second T2WI;
    trimming said co-registered first T2WI and said co-registered second T2WI;
    determining a $\Delta R_2$ map based on each pixel of said trimmed first T2WI and corresponding pixels of said trimmed second T2WI; and
    constructing a three-dimensional (3D) map based on said $\Delta R_2$ map.

2. The method claim 1 further comprising generating 3D images of vessels of said subject based on said 3D map without sensitivity to flow of matter through said vessels, wherein said vessels include at least one of veins, sinuses, arterioles, venules, and capillaries.

3. The method of claim 1 further comprising rendering in-vivo microvascular architecture and generating microvascular fluid volume data for vessels of said subject based on said 3D map, wherein said vessels include at least one of veins, sinuses, arterioles, venules, and capillaries.

4. A method comprising:
    generating three-dimensional (3D) images of vessels including microvessels of a subject without sensitivity to flow of matter through said vessels;
    generating in-vivo microvascular architecture data and microvascular fluid volume data for said vessels based on said 3D images;
    generating said 3D images based on steady-state 3D $\Delta R_2$-based microscopic magnetic resonance angiography (3D$\Delta R_2$-mMRA) that includes:
        performing a first T2-weighted imaging (T2WI) on said subject;

injecting said subject with a contrast agent after performing said first T2WI;

waiting a predetermined period of time before performing a second T2WI on said subject;

co-registering said first T2WI and said second T2WI;

trimming said co-registered first T2WI and said co-registered second T2WI;

determining a $\Delta R_2$ map based on each pixel of said trimmed first T2WI and corresponding pixels of said trimmed second T2WI;

constructing a 3D map based on said $R_2$ map; and generating said 3D images based on said 3D map.

5. The method of claim 4 further comprising generating said 3D images of said vessels that include at least one of veins, sinuses, arterioles, venules, and capillaries.

6. The method claim 4 further comprising rendering at least one of intracortical and subcortical microvasculature of said vessels in said 3D images.

7. The method of claim 4 further comprising rendering said microvascular architecture in said 3D images and generating said microvascular fluid volume data using at least one of maximum intensity projection and volume rendering.

8. The method of claim 4 further comprising identifying at least one of intracortical arterioles and intracortical venules with slow-moving spins in said subject from said 3D images.

9. The method of claim 4 further comprising generating said 3D images based on a magnetic susceptibility effect that is insensitive to flow-related artifacts including at least one of turbulent and pulsatile flows through said vessels.

10. The method of claim 4 further comprising generating said 3D images without sensitivity to a geometric distortion caused by magnetic field inhomogeneities at an air-tissue interface in said subject.

11. The method of claim 4 further comprising generating said 3D images without sensitivity to changes in magnetic susceptibility caused by discontinuities in tissue properties in said subject.

12. The method of claim 4 further comprising revealing in-vivo microangiographic processes in ischemia in said subject based on said 3D images.

13. The method of claim 4 further comprising tracing angiogenesis in a lesion area in said subject in presence of tissue necrosis in said lesion area based on said 3D images.

14. A method comprising:

rendering three dimensional (3D) images of microvasculature of a tumor in a subject using steady-state 3D $\Delta R_2$-based microscopic magnetic resonance angiography (3D$\Delta R_2$-mMRA); and measuring hemodynamic parameters including at least one of blood volume, blood flow, and permeability of vessels associated with said tumor using said 3D$\Delta R_2$-mMRA.

15. The method of claim 14 further comprising determining functional and structural changes in said microvasculature based on said 3D images and said hemodynamic parameters.

16. The method of claim 14, wherein said 3D$\Delta R_2$-mMRA includes:

performing a first T2-weighted imaging (T2WI) on said subject;

injecting said subject with a contrast agent after performing said first T2WI;

waiting a predetermined period of time before performing a second T2WI on said subject;

co-registering said first T2WI and said second T2WI;

trimming said co-registered first T2WI and said co-registered second T2WI;

determining a $\Delta R_2$ map based on each pixel of said trimmed first T2WI and corresponding pixels of said trimmed second T2WI;

constructing a 3D map based on said $\Delta R_2$ map; and generating said 3D images based on said 3D map.

17. The method claim 14 further comprising generating said 3D images and measuring said hemodynamic parameters based on said 3D map.

18. A system comprising:

a T2-weighted imaging (T2WI) module that performs a first T2-weighted imaging (T2WI) on a subject and that performs a second T2WI on said subject after said subject is injected with a contrast agent;

a co-registering module that co-registers said first T2WI and said second T2WI and that generates co-registered first T2WI and co-registered second T2WI;

a trimming module that trims said co-registered first T2WI and said co-registered second T2WI and that generates trimmed first T2WI and trimmed second T2WI;

a $\Delta R_2$ mapping module that generates a $\Delta R_2$ map based on each pixel of said trimmed first T2WI and corresponding pixels of said trimmed second T2WI; and a 3D mapping module that generates a three-dimensional (3D) map based on said $\Delta R_2$ map.

19. The system claim 18 further comprising a 3D imaging module that generates 3D images of vessels of said subject based on said 3D map without sensitivity to flow of matter through said vessels, wherein said 3D images render in-vivo microvascular architecture of said vessels, and wherein said vessels include at least one of veins, sinuses, arterioles, venules, and capillaries.

20. The system of claim 18 further comprising a hemodynamic data module that generates hemodynamic data including microvascular fluid volume data for vessels of said subject based on said 3D map, wherein said vessels include at least one of veins, sinuses, arterioles, venules, and capillaries.

21. A system comprising:

a three-dimensional (3D) imaging module that generates 3D images of vessels of a subject without sensitivity to flow of matter through said vessels, wherein said 3D images render in-vivo microvascular architecture of said vessels, where said vessels include at least one of veins, sinuses, arterioles, venules, and capillaries; and a hemodynamic data module that generates hemodynamic data including microvascular fluid volume data for said vessels based on said 3D images.

22. The system of claim 21, wherein said 3D imaging module generates said 3D images based on steady-state 3D $\Delta R_2$-based microscopic magnetic resonance angiography (3D$\Delta R_2$-mMRA), and wherein said hemodynamic data module generates said hemodynamic data based on said 3D$\Delta R_2$-mMRA.

23. The system of claim 21 further comprising:

a T2-weighted imaging (T2WI) module that performs a first T2-weighted imaging (T2WI) on said subject and that performs a second T2WI on said subject after said subject is injected with a contrast agent;

a co-registering module that co-registers said first T2WI and said second T2WI and that generates co-registered first T2WI and co-registered second T2WI;

a trimming module that trims said co-registered first T2WI and said co-registered second T2WI and that generates trimmed first T2WI and trimmed second T2WI;

a $\Delta R_2$ mapping module that generates a $\Delta R_2$ map based on each pixel of said trimmed first T2WI and corresponding pixels of said trimmed second T2WI; and a 3D mapping module that generates a 3D map based on said $\Delta R_2$ map.

24. The system of claim 22, wherein said 3D imaging module generates said 3D images based on said 3D map, and wherein said hemodynamic data module generates said hemodynamic data based on said 3D map.

25. The system of claim 21 further comprising a rendition control module that renders said microvascular architecture and said microvascular fluid volume data in said 3D images using at least one of maximum intensity projection and volume rendering.

26. The system of claim 21 further comprising:
a data acquisition module that uses an acquisition matrix and that acquires data on said subject from a magnetic resonance apparatus; and
a control module that controls resolution of said 3D images by controlling at least one of a size of said acquisition matrix, an imaging sensitivity of said magnetic resonance apparatus, a field of view of said magnetic resonance apparatus, and a refocus pulse of said magnetic resonance apparatus.

27. The system claim 21, wherein said 3D imaging module renders at least one of intracortical and subcortical microvasculature of said vessels in said 3D images.

28. The system of claim 21, wherein said 3D imaging module generates renditions of at least one of intracortical arterioles and intracortical venules with slow-moving spins in said subject.

29. The system of claim 21, wherein said 3D imaging module generates said 3D images based on a magnetic susceptibility effect that is insensitive to flow-related artifacts including at least one of turbulent and pulsatile flows through said vessels.

30. The system of claim 21, wherein said 3D imaging module generates said 3D images without sensitivity to a geometric distortion caused by magnetic field inhomogeneities at an air-tissue interface in said subject.

31. The system of claim 21, wherein said 3D imaging module generates said 3D images without sensitivity to changes in magnetic susceptibility caused by discontinuities in tissue properties in said subject.

32. The system of claim 21, wherein said 3D imaging module generates said 3D images that reveal in-vivo microangiographic processes in ischemia in said subject.

33. The system of claim 21, wherein said 3D imaging module generates said 3D images that indicate angiogenesis in a lesion area in said subject in presence of tissue necrosis in said lesion area.

34. A system comprising:
a three dimensional (3D) imaging module that renders 3D images of microvasculature of a tumor in a subject using steady-state 3D $\Delta R_2$-based microscopic magnetic resonance angiography (3D$\Delta R_2$-mMRA); and
a hemodynamic data module that measures hemodynamic parameters including at least one of blood volume, blood flow, and permeability of vessels associated with said tumor using said 3D$\Delta R_2$-mMRA.

35. The system of claim 34 further comprising:
a T2-weighted imaging (T2WI) module that performs a first T2-weighted imaging (T2WI) on said subject and that performs a second T2WI on said subject after said subject is injected with a contrast agent;
a co-registering module that co-registers said first T2WI and said second T2WI and that generates co-registered first T2WI and co-registered second T2WI;
a trimming module that trims said co-registered first T2WI and said co-registered second T2WI and that generates trimmed first T2WI and trimmed second T2WI;
a $\Delta R_2$ mapping module that generates a $\Delta R_2$ map based on each pixel of said trimmed first T2WI and corresponding pixels of said trimmed second T2WI; and
a 3D mapping module that generates a 3D map based on said $\Delta R_2$ map.

36. The system of claim 35, wherein said 3D imaging module generates said 3D images based on said 3D map, and wherein said hemodynamic data module generates said hemodynamic data based on said 3D map.

* * * * *